(12) United States Patent
Yoshimura et al.

(10) Patent No.: US 8,663,905 B2
(45) Date of Patent: Mar. 4, 2014

(54) PATTERN-FORMING METHOD

(75) Inventors: Nakaatsu Yoshimura, Tokyo (JP); Yousuke Konno, Tokyo (JP)

(73) Assignee: JSR Corporation, Tokyo (JP)

( * ) Notice: Subject to any disclaimer, the term of this patent is extended or adjusted under 35 U.S.C. 154(b) by 609 days.

(21) Appl. No.: 12/515,061

(22) PCT Filed: Nov. 19, 2007

(86) PCT No.: PCT/JP2007/072704
§ 371 (c)(1),
(2), (4) Date: May 15, 2009

(87) PCT Pub. No.: WO2008/062888
PCT Pub. Date: May 29, 2008

(65) Prior Publication Data
US 2010/0081082 A1    Apr. 1, 2010

(30) Foreign Application Priority Data

Nov. 20, 2006  (JP) ................................ 2006-313128

(51) Int. Cl.
G03F 7/20 (2006.01)
G03F 7/30 (2006.01)
G03F 7/36 (2006.01)

(52) U.S. Cl.
USPC ........... 430/311; 430/313; 430/323; 430/325; 430/326

(58) Field of Classification Search
None
See application file for complete search history.

(56) References Cited

U.S. PATENT DOCUMENTS 5,561,026 A    10/1996  Aoki
2007/0082965 A1*  4/2007  Yasuda et al. .................. 522/15

FOREIGN PATENT DOCUMENTS

| | | |
|---|---|---|
| EP | 0744662 | 11/1996 |
| JP | 6-19136 | 1/1994 |
| JP | 09-043839 | 2/1997 |
| JP | 2000-143937 | 5/2000 |
| JP | 2001-040293 | 2/2001 |
| JP | 2001-215694 | 8/2001 |
| JP | 2001-272788 | 10/2001 |
| JP | 2004-177772 | 6/2004 |
| JP | 2004/264384 | 9/2004 |
| JP | 2004-264710 | 9/2004 |
| JP | 2004-279694 | 10/2004 |
| JP | 2006-199674 | 8/2006 |
| JP | 2006-227391 | 8/2006 |

OTHER PUBLICATIONS

Derwent English abstract for JP2004-264384 (Ichinohe et al)—Sep. 24, 2004.*
Machine-assisted English translation of JP2004-264384 provided by JPO—Sep. 24, 2004.*
Hirsch et al "Globe-trotting Hydrogens on the Surface of the Fullerene Compound C60H6(N(CH2CH2)2O)6", Angewandte Chemie International Edition in English, vol. 30, Issue 10, p. 1309 (1991)).*
Troshina et al ("Reactions of chlorofullerene C60Cl6 with N-substituted piperazines", Tetrahedron, vol. 62, p. 10147-10151 (2006)).*
Extended European Search Report for corresponding EP Application No. 07832430.8-1226, Nov. 25, 2010.
European Office Action for corresponding EP Application No. 07 832 430.8-1226, Sep. 2, 2011.

* cited by examiner

*Primary Examiner* — Sin J. Lee
(74) *Attorney, Agent, or Firm* — Ditthavong Mori & Steiner, P.C.

(57) ABSTRACT

A resist under layer film-forming composition comprises (A) an aminated fullerene having at least one amino group bonded to a fullerene skeleton, and (B) a solvent. The composition exhibits excellent etching resistance, causes an under layer film pattern to bend only with difficulty in a dry etching process, and can transfer a resist pattern faithfully onto a substrate to be processed with high reproducibility.

4 Claims, 1 Drawing Sheet

PATTERN-FORMING METHOD

TECHNICAL FIELD

The present invention relates to a composition for forming a resist under layer film suitable for microfabrication by a lithographic process using various types of radiation, particularly for preparing highly integrated circuit elements, and to a pattern forming method. More particularly, the present invention relates to a composition for forming a resist under layer film having excellent etching resistance and capable of faithfully transferring a resist pattern to a substrate in a reproducible manner without bending the under layer film pattern in a dry etching process, and to a pattern-forming method.

BACKGROUND ART

A process for fabricating semiconductor devices includes several steps for stacking two or more materials on a silicon wafer as a film to be processed and patterning the films with desired patterns. In patterning the films, a photosensitive material called a resist is first stacked on the film to form a resist film and radiation is applied to the prescribed areas of the resist film.

Exposed unit or un-exposed unit of the resist film is removed by a developing treatment to form a resist pattern. The film to be processed is then dry-etched using the resist pattern as a mask.

In this process, ultraviolet rays such as from an ArF excimer laser are used as an exposing source to be exposed to the resist film. Along with an increase in the demand for miniaturization of a large scale integrated circuit (LSI) in the present time, a degree of resolution smaller than the wavelength of the rays used for exposure is required in some cases.

When the resolution decreases to a level less than the wavelength of the rays used, exposure process tolerance such as exposure dose tolerance and focus tolerance may become insufficient. In order to compensate such a shortage of exposure process tolerance, increasing resolution by decreasing the resist film thickness is effective. This method, however, makes it difficult to provide a film with a thickness necessary for etching the film to be processed.

For this reason, a process of first forming a resist under layer film (hereinafter referred to from time to time as "under layer film") on the film to be processed, then forming an under layer film pattern by transferring a resist pattern onto the under layer film, and transferring that pattern onto the film to be processed using the under layer film pattern as an etching mask is studied. A material having etching resistance is preferably used as the under layer film in such a process.

As such a material for forming an under layer film, a composition containing a resin having a benzene ring which is known to exhibit etching resistance by absorbing energy during etching, in particular, a composition containing a thermosetting phenol novolac, a composition containing a polymer having an acenaphthylene skeleton, and the like have been proposed (see Patent Documents 1 and 2, for example).

As a material for forming an under layer film, a composition containing a specific fullerene compound having an aryl group with 6 to 16 carbon atoms which may contain a phenolic hydroxyl group has also been proposed (see Patent Document 3, for example).

Patent Document 1: JP-A-2001-40293
Patent Document 2: JP-A-2000-143937
Patent Document 3: JP-A-2006-227391

DISCLOSURE OF THE INVENTION

However, along with the progress of further downsizing of etching patterns, over-etching of a resist under layer film has become a serious problem. Further improvement of etching resistance is desired. Miniaturization of etching patterns increases the aspect ratio of the under layer film pattern (ratio of the pattern width (line width) to the thickness of the under layer film), which causes another problem of bending the under layer film pattern during etching of the substrate.

For example, the composition described in the Patent Document 3, which exhibits only a low bending resistivity as an under layer film pattern, causes the under layer film pattern to bend during etching of the substrate, failing to faithfully transfer the resist pattern to the substrate.

The present invention has been completed in view of the above problems in general technologies and has an object of providing a composition for forming a resist under layer film having excellent etching resistance and capable of faithfully transferring a resist pattern to a substrate in a reproducible manner without bending the under layer film pattern, particularly in a dry etching process, and also providing a pattern-forming method.

As a result of extensive studies in order to develop a composition for forming such a resist under layer film, the inventors of the present invention have found that a resist under layer film formed from a composition containing a specific aminated fullerene has excellent etching resistance as compared with general resist under layer films and that the under layer film does not bend in the etching process of the substrate. These findings have led to the completion of the present invention. Specifically, the following resist under layer film-forming composition and pattern-forming method are provided according to the present invention.

[1] A resist under layer film-forming composition comprising (A) an aminated fullerene having an amino group bonded to a fullerene skeleton, and (B) a solvent.

[2] The composition according to [1], further comprising (C) an acid generator.

[3] The composition according to [1], further comprising (D) a crosslinking agent.

[4] The composition according to [1], further comprising (E) a thermoset resin.

[5] A method for forming a resist under layer film comprising applying the composition defined in any one of the above [1] to [4] to a substrate, and baking the applied composition in an inert gas atmosphere together with the substrate to form a resist under layer film on the substrate.

[6] A pattern-forming method comprising (1) a step of forming a resist under layer film on a substrate by applying the composition according to any one of [1] to [4], (2) a step of forming a resist film on the resist under layer film by applying a resist composition, (3) a step of selectively exposing the resist film to radiation through a photomask, (4) a step of developing the exposed resist film to form a resist pattern, and (5) a step of dry etching the resist under layer film and the substrate using the resist pattern as a mask to form a pattern.

A resist under layer film having excellent etching resistance and capability of prohibiting bending of an under layer film pattern in an etching process of a substrate can be formed by using the resist under layer film-forming composition of the present invention. In particular, the resist under layer film having excellent etching resistance has capability of transferring precise patterns and exhibiting excellent etching selectivity in a dry-etching process. Such capability ensures faithful transfer of a resist pattern to the substrate with good reproducibility and minimal over-etching of the resist under layer film.

In addition, an improvement of production yield in microfabrication, particularly in the production of high-integrated circuit elements can be expected because of the capability of prohibiting bending of the under layer film pattern in an etching process of a substrate.

Furthermore, according to the method for forming a resist under layer film of the present invention, a resist under layer film having excellent etching resistance and capability of prohibiting bending of an under layer film pattern in an etching process of a substrate can be formed by using the resist under layer film-forming composition of the present invention. Moreover, the pattern-forming method of the present invention ensures faithful transfer of a resist pattern to a substrate with good reproducibility in a dry-etching process.

EXPLANATION OF SYMBOLS

Figure 1:
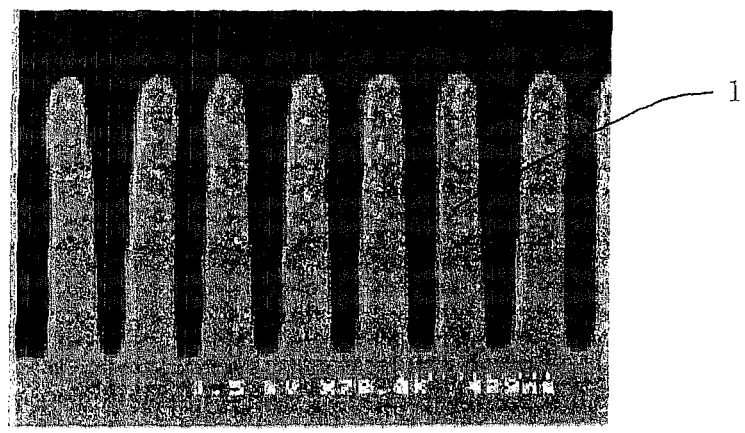
FIG. 1 is a scanning electron microscope photograph showing a cross-section of a resist under layer film pattern formed using the resist under layer film-forming composition of Example 9.

1 . . . Resist under layer film pattern

BEST MODE FOR CARRYING OUT THE INVENTION

The embodiments of present invention will now be described in detail. The following description, however, is not intended to limit the present invention. Various modifications and improvements may be made on the embodiments without departing from the scope of the present invention based on the knowledge of a person having an ordinary skill in the art.

[1] Composition for Forming Resist Under Layer Film

One embodiment of the resist under layer film-forming composition will be first described. The resist under layer film-forming composition of the present invention comprises (A) an aminated fullerene having an amino group bonded to a fullerene skeleton and (B) a solvent.

A resist under layer film (hereinafter referred to from time to time as "under layer film") having excellent etching resistance and capability of prohibiting bending of an under layer film pattern in an etching process of a substrate can be formed by using the resist under layer film-forming composition of the present invention. In particular, the resist under layer film has excellent capability of transferring precise patterns and exhibits good etching selectivity in a dry-etching process, and ensures faithful transfer of a resist pattern to the substrate with good reproducibility and minimal over-etching of the resist under layer film.

In addition, an improvement of the production yield of microfabrication in lithographic process, particularly the yield of high integrated circuit elements, can be expected because of the capability of prohibiting bending of the under layer film pattern in the etching process of a substrate.

In order to promote durability of the resist lower film and to prevent bending of the under layer film pattern, increasing the carbon content and decreasing the hydrogen content of the resist under layer film are effective. In the resist under layer film-forming composition of the present invention, the carbon content can be increased and the hydrogen content can be decreased as compared with a known resist under layer film-forming composition which contains a common fullerene derivative.

Specifically, since the resist under layer film-forming composition of the present invention contains the aminated fullerene (A), the amino groups which substantially reduce the carbon content and increase the hydrogen content of the resist under layer film decompose. As a result, the carbon content of the resist under layer film increases and the hydrogen content decreases.

In addition to the aminated fullerene (A) and the solvent (B), the resist under layer film-forming composition of the present invention may contain (C) an acid generator. The acid generator accelerates decomposition of the amino group of the aminated fullerene (A) at a relatively low temperature including an ordinary temperature, whereby a resist under layer film with a high carbon content and a low hydrogen content can be easily formed.

The resist under layer film-forming composition of the present invention may further comprise (D) a crosslinking agent. The crosslinking agent (D) is a component effective for preventing intermixing between the resulting resist under layer film and a resist film produced thereon and also preventing cracks in the resist under layer film.

The resist under layer film-forming composition of the present invention may further comprise (E) a thermoset resin. The thermoset resin (E) becomes insoluble in a solvent when cured by heating and has a function of preventing intermixing between the resist under layer film and the resist film formed on the resist under layer film.

[1-1] (A) Aminated Fullerene

The aminated fullerene (A), which is a fullerene derivative used in the resist under layer film-forming composition of the present invention, has an amino group bonded to the fullerene skeleton as a substituent. That is to say, the aminated fullerene may be any compound having an amino group substituted on a fullerene skeleton. The fullerene skeleton may have other substituents. The aminated fullerene may also be a fullerene derivative utilizing the double bond of the fullerene skeleton.

As examples of the other substituents, a hydroxyl group, an epoxy group, a fluorine atom, a chlorine atom, a bromine atom, an alkyl group, an aryl group, and an alkoxy group can be given. Such an aminated fullerene (A) can be obtained by, for example, reacting a fullerene with a secondary amine.

The aminated fullerene (A) used in the resist under layer film-forming composition of the present invention can be produced using a method of synthesizing aminated fullerenes that has been reported heretofore. For example, a method of synthesizing an aminated fullerene by a direct addition reaction of an amino compound can be given.

The above methods of synthesis are described in, for example, Schick, G.; Kampe, K,-D.; Hirsch, A. J. Chem. Soc., Chem. Commun. 1995, 2023-2024, and Fred Wudl and Angew. Chem. Int. Ed. Engl., 30, 1991, 1309-1310. The methods are also disclosed by JP-A-2002-88075, Hideo Nagashima, Special Issue on "Chemistry of C60, Chemistry of Fullerenes" p 116-124 (Kagaku-Dojin, Apr. 30, 1993), and the like.

The term "fullerene" in the present invention refers to a carbon cluster of a closed shell in which carbon atoms are arranged in the shape of a glob or a rugby ball. The number of carbon atoms in a fullerene is usually 60 to 120. As specific examples, $C_{60}$ (buckminsterfullerene), $C_{70}$, $C_{76}$, $C_{78}$, $C_{82}$, $C_{84}$, $C_{90}$, $C_{94}$, $C_{96}$, and higher order carbon clusters can be given. As the fullerene for forming the aminated fullerene (A) used in the resist under layer film-forming composition of the present invention, $C_{60}$ and $C_{70}$ fullerenes are preferable due to their easy availability.

The secondary amine used for synthesizing the aminated fullerene (A) is a compound which has a structure in which two hydrogen atoms of an ammonia molecule are substituted with organic groups, generally shown by a formula NHR1R2, wherein R1 and R2 indicate organic groups which are either the same or different or R1 and R2 bond together to form a heterocyclic ring containing a nitrogen atom (N).

When R1 and R2 do not bond together, R1 and R2 are usually substituted or unsubstituted hydrocarbon groups having 1 to 15 carbon atoms. As specific examples, a methyl group, an ethyl group, a propyl group, an isopropyl group, a butyl group, a t-butyl group, a pentyl group, a hexyl group, a cyclopropyl group, a cyclopentyl group, a cyclohexyl group, a phenyl group, a benzyl group, and a phenethyl group, as well as these hydrocarbon groups with a substitutent can be given.

The substitutent of R1 and R2 may be any group insofar as the number of carbon atoms of R1 and R2 including the number of carbon atoms of the substituents is 1 to 15. Specifically, an alkoxy group such as a methoxy group and a phenoxy group; a siloxy group such as a trimethylsiloxy group; an alkoxycarbonyl group such as a t-butoxycarbonyl group and a benzyloxycarbonyl group; an acyl group such as an acetyl group and a benzoyl group; a ketal group such as an ethylenedioxy group; an acetal group such as a tetrahydropiranyloxy group; and the like can be used. In addition, an alkyl group, an aryl group, and an aralyl group having the above-mentioned substituents such as a (t-butyldimethylsilyloxy) methyl group can be used as the substituent of R1 and R2.

When R1 and R2 bond together to form a heterocyclic ring containing N, R1 and R2 are usually a divalent organic group having 3 to 6 carbon atoms and may contain a heteroatom such as oxygen, nitrogen, and sulfur in the R1-R2 chain.

As the heterocyclic ring, a four to seven membered ring having at least one secondary nitrogen atom is preferable. Specific examples of the compound shown by NHR1R2, wherein R1 and R2 bond together, are shown by the following formulas (1-1) to (1-13). In the formulas (1-1) to (1-13), the above-mentioned substituents may be contained on the heterocyclic ring.

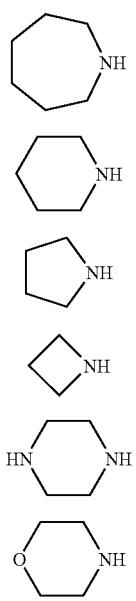

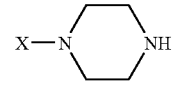

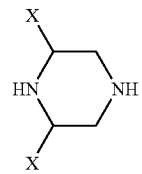

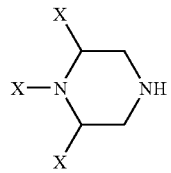

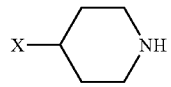

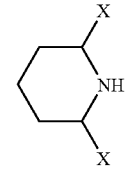

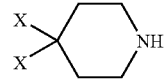

In the formulas (1-8) to (1-13), X indicates the substituents contained in R1 and R2, and X may be the same or different when there are more than one Xs.

The aminated fullerene (A) used in the resist under layer film-forming composition of the present invention may be obtained by reacting these fullerenes and the secondary amines by the above methods of synthesis and the like. The aminated fullerene (A) preferably used is a $C_{60}$ fullerene and the secondary amine preferably used is a compound which is easily decomposed by heat or with an acid such as t-butoxycarbonylpiperazine, dibenzylamine, and morpholine.

As the secondary amine which is easily decomposed by heat, an amine which is decomposed below 350° C. is preferable and an amine which is decomposed below 250° C. is more preferable. The acidity of the secondary amine which is easily decomposed with an acid is usually a pH of 6 or less, and preferably a pH of 2 or less.

The aminated fullerene (A) synthesized using the secondary amine which is easily decomposed by heat or with an acid can increase the carbon content and decrease the hydrogen content of the resist lower film, since the amino group which substantially decreases the carbon content and increases the hydrogen content are decomposed when forming the resist under layer film, as mentioned above.

[1-2] (B) Solvent

The resist under layer film-forming composition of the present invention comprises a solvent (B). The solvent (B) is capable of dissolving the aminated fullerene (A). The following compounds may be appropriately selected to be used as the solvent (B): ethylene glycol monoalkyl ethers such as ethylene glycol monomethyl ether, ethylene glycol monoethyl ether, ethylene glycol mono-n-propyl ether, and ethylene glycol mono-n-butyl ether; ethylene glycol monoalkyl ether acetates such as ethylene glycol monomethyl ether acetate, ethylene glycol monethyl ether acetate, ethylene glycol mono-n-propyl ether acetate, and ethylene glycol mono-n-butyl ether acetate; diethylene glycol dialkyl ethers such as diethylene glycol dimethyl ether, diethylene glycol diethyl ether, diethylene glycol di-n-propyl ether, and diethylene glycol di-n-butyl ether; triethylene glycol dialkyl ethers such as triethylene glycol dimethyl ether and triethylene glycol diethyl ether;

propylene glycol monoalkyl ethers such as propylene glycol monomethyl ether, propylene glycol monethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monethyl ether acetate, propylene glycol mono-n-propyl ether acetate, and propylene glycol mono-n-butyl ether acetate;

lactic acid esters such as methyl lactate, ethyl lactate, n-propyl lactate, i-propyl lactate, n-butyl lactate, and i-butyl lactate; aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butylate, ethyl butylate, n-propyl butylate, i-propyl butylate, n-butyl butylate, and i-butyl butylate;

other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxypropyl acetate, 3-methoxybutyl acetate, 3-methyl-3-methoxybutyl acetate, 3-methyl-3-methoxybutyl propionate, 3-methyl-3-methoxybutyl butyrate, methyl acetoacetate, methyl pyruvate, and ethyl pyruvate; aromatic hydrocarbons such as toluene and xylene; ketones such as methyl ethyl ketone, methyl n-propyl ketone, methyl n-butyl ketone, 2-heptanone, 3-heptanone, 4-heptanone, and cyclohexanone; amides such as N-methyl formamide, N,N-dimethyl formamide, N-methyl acetamide, N,N-dimethyl acetamide, and N-methyl pyrrolidone; and lactones such as γ-butyrolactone.

Among these, propylene glycol monomethyl ether, ethylene glycol monoethyl ether acetate, ethyl lactate, n-butyl acetate, ethyl 3-ethoxypropionate, methyl 3-methoxypropionate, 2-heptanone, cyclohexanone, γ-butyrolactone, and the like are preferable as the solvent (B). These solvents (B) may be used individually or in combination of two or more.

Although not particularly limited, the solvent (B) is preferably contained in an amount to make the solid concentration of the resist under layer film-forming composition of the present invention 5 to 80 mass %. The solid concentration of the resist under layer film-forming composition of the present invention is more preferably 5 to 40 mass %, and particularly preferably 10 to 30 mass %. If the solid concentration of the resist under layer film-forming composition of the present invention is 5 to 80 mass %, the resist under layer film-forming composition may be coated nicely on the substrate.

[1-3] (C) Acid Generator

The resist under layer film-forming composition of the present invention may contain the acid generator (C) as required, insomuch as the desired effect of the present invention is not reduced.

The acid generator (C) is a component which generates an acid by exposure or heat. Examples of the acid generator which generates an acid by exposure (hereinafter referred to as "photoacid generator") include an onium salt photoacid generator such as diphenyliodoniumtrifluoromethane sulfonate, diphenyliodoniumnonafluoro-n-butane sulfonate, diphenyliodoniumpyrene sulfonate, diphenyliodonium-n-dodecylbenzene sulfonate, diphenyliodonium 10-camphorsulfonate, diphenyliodoniumnaphthalene sulfonate, diphenyliodonium hexafluoroantimonate, bis(4-t-butylphenyl)iodoniumtrifluoromethane sulfonate, bis(4-t-butylphenyl)iodoniumnonafluoro-n-butane sulfonate, bis(4-t-butylphenyl)iodonium-n-dodecylbenzene sulfonate, bis(4-t-butylphenyl)iodonium 10-camphorsulfonate, bis(4-t-butylphenyl)iodoniumnaphthalene sulfonate, bis(4-t-butylphenyl)iodonium hexafluoroantimonate, triphenylsulfoniumtrifluoromethane sulfonate, triphenylsulfoniumnonafluoro-n-butane sulfonate, triphenylsulfonium-n-dodecylbenzene sulfonate, triphenylsulfoniumnaphthalene sulfonate, triphenylsulfonium 10-camphorsulfonate, triphenylsulfonium hexafluoroantimonate, 4-hydroxyphenyl phenyl methylsulfonium p-toluenesulfonate, 4-hydroxyphenyl benzyl methylsulfonium p-toluenesulfonate, cyclohexyl methyl 2-oxocyclohexylsulfonium trifluoromethanesulfonate, 2-oxocyclohexyldicyclohexylsulfonium trifluoromethanesulfonate, 2-oxocyclohexyldimethylsulfonium trifluoromethanesulfonate, 1-naphtyldimethylsulfonium trifluoromethanesulfonate, 1-naphtyldiethylsulfonium trifluoromethanesulfonate, 4-cyano-1-naphtyldimethylsulfonium trifluoromethanesulfonate, 4-cyano-1-naphtyldiethylsulfonium trifluoromethanesulfonate, 4-nitro-1-naphtyldimethylsulfonium trifluoromethanesulfonate, 4-nitro-1-naphtyldiethylsulfonium trifluoromethanesulfonate, 4-methyl-1-naphtyldimethylsulfonium trifluoromethanesulfonate, 4-methyl-1-naphtyldiethylsulfonium trifluoromethanesulfonate, 4-hydroxy-1-naphtyldimethylsulfonium trifluoromethanesulfonate, 4-hydroxy-1-naphtyldiethylsulfonium trifluoromethanesulfonate,
1-(4-hydroxynaphthalen-1-yl)tetrahydrothiophenium trifluoromethanesulfonate, 1-(4-methoxynaphthalen-1-yl)tetrahydrothiophenium trifluoromethanesulfonate, 1-(4-ethoxynaphthalen-1-yl)tetrahydrothiophenium trifluoromethanesulfonate, 1-(4-methoxymethoxynaphthalen-1-yl)tetrahydrothiophenium trifluoromethanesulfonate, 1-(4-ethoxymethoxynaphthalen-1-yl)tetrahydrothiophenium trifluoromethanesulfonate, 1-[4-(1-methoxyethoxy)naphthalen-1-yl]tetrahydrothiophenium trifluoromethanesulfonate, 1-[4-(2-methoxyethoxy)naphthalen-1-yl]tetrahydrothiophenium trifluoromethanesulfonate, 1-(4-methoxycarbonyloxynaphthalen-1-yl) tetrahydrothiophenium trifluoromethanesulfonate, 1-(4-ethoxycarbonyloxynaphthalen-1-yl)tetrahydrothiophenium trifluoromethanesulfonate, 1-(4-n-propoxycarbonyloxynaphthalen-1-yl)tetrahydrothiophenium trifluoromethanesulfonate,
1-(4-i-propoxycarbonyloxynaphthalen-1-yl)tetrahydrothiophenium trifluoromethane sulfonate, 1-(4-n-butoxycarbonyloxynaphthalen-1-yl)tetrahydrothiophenium trifluoromethane sulfonate, 1-(4-t-butoxycarbonyloxynaphthalen- 1-yl)tetrahydrothiophenium trifluoromethane sulfonate, 1-[4-(2-tetrahydrofuranyloxy)naphthalen-1-yl]tetrahydrothiophenium trifluoromethane sulfonate, 1-[4-(2-tetrahydropyranyloxy)naphthalen-1-yl]tetrahydrothiophenium trifluoromethane sulfonate, 1-(4-benzyloxy) tetrahydrothiopheniumtrifluoromethane sulfonate, 1-(naphthylacetomethyl)tetrahydrothiopheniumtrifluoromethane sulfonate, and the like;

halogen-containing type photoacid generators such as phenyl bis(trichloromethyl)-s-triazine, 4-methoxyphenyl bis(trichloromethyl)-s-triazine, and 1-naphthyl bis(trichloromethyl)-s-triazine; diazoketone photoacid generators such as 1,2-naphthoquinone diazido-4-sulfonylchloride, 1,2-naphthoquinone diazido-5-sulfonylchloride, 1,2-naphthoquinone diazido-4-sulfonate or 1,2-naphthoquinone diazido-5-sulfonate of 2,3,4,4'-tetrahydroxybenzophenone; sulfone photoacid generators such as 4-trisphenacylsulfone, mesitylphenacylsulfone, and bis(phenylsulfonyl)methane; sulfonic acid photoacid generators such as benzointosylate, tris(trifluoromethanesulfonate) of pyrogallol, nitrobenzyl-9,10-diethoxyanthracene-2-sulfonate, trifluoromethanesulfonyl bicyclo[2,2,1]hept-5-en-2,3-dicarbodimide, N-hydroxysuccinimide trifluoromethanesulfonate, and 1,8-naphthalenedicarboxylate imide trifluoromethanesulfonate.

Among these photoacid generators, diphenyliodoniumtrifluoromethane sulfonate, diphenyliodoniumnonafluoro-n-butane sulfonate, diphenyliodonium pyrene sulfonate, diphenyliodonium-n-dodecylbenzene sulfonate, diphenyliodonium 10-camphorsulfonate, diphenyliodoniumnaphtalene sulfonate, bis(4-t-butylphenyl)iodoniumtrifluoromethane sulfonate, bis(4-t-butylphenyl)iodoniumnonafluoro-n-butane sulfonate, bis(4-t-butylphenyl)iodonium-n-dodecylbenzene sulfonate, bis(4-t-butylphenyl)iodonium 10-camphorsulfonate, bis(4-t-butylphenyl)iodoniumnaphthalene sulfonate, and the like are preferably used. These photoacid generators may be used individually or in combination of two or more.

As examples of the acid generators which generates an acid when heated (hereinafter referred to as "thermal acid generator"), 2,4,4,6-tetrabromocyclohexadienone, benzointosylate, 2-nitrobenzyltosylate, alkyl sulfonates, and the like can be given. These thermal acid generators may be used individually or in combination of two or more. A photoacid generator and a thermal acid generator may be used in combination as the acid generator (C).

These photoacid generators and thermal acid generators, if contained as the acid generator (C) in the resist under layer film-forming composition of the present invention, can accelerate decomposition of the amino group in the aminated fullerene (A) at a relatively low temperature (normal temperature), whereby the resist under layer film with high carbon content and low hydrogen content can be effectively obtained.

The amount of the acid generator (C) is preferably 100 parts by mass or less, more preferably 0.1 to 30 parts by mass, and particularly preferably 0.1 to 10 parts by mass for 100 parts by mass of the aminated fullerene (A). The effects mentioned above may be achieved by adding the acid generator (C) in an amount in these ranges.

[1-4] (D) Crosslinking Agent

The resist under layer film-forming composition of the present invention may contain the crosslinking agent (D) as required, insomuch as the desired effect of the present invention is not reduced. The crosslinking agent (D) is a component effective for preventing intermixing between the resulting resist under layer film and a resist film produced thereon and also preventing cracks in the resist under layer film.

Polynuclear phenols and various commercially available curing agents can be used as such a crosslinking agent (D). Examples of the polynuclear phenols are binuclear phenols such as 4,4'-biphenyldiol, 4,4'-methylenebisphenol, 4,4'-ethylidenebisphenol, bisphenol A, and the like; trinuclear phenols such as 4,4',4"-methylidenetrisphenol, 4,4'-[1-{4-(1-[4-hydroxyphenyl]-1-methylethyl)phenyl}-ethylidene] bisphenol, and the like; and polyphenols such as novolac and the like.

Of these, 4,4'-[1-{4-(1-[4-hydroxyphenyl]-1-methylethyl)-phenyl}ethylidene]bisphenol, novolac, and the like are preferable. These polynuclear phenols may be used individually or in combination of two or more.

As the curing agent, diisocyanates such as 2,3-tolylenediisocyanate, 2,4-tolylenediisocyanate, 3,4-tolylenediisocyanate, 3,5-tolylenediisocyanate, 4,4'-diphenylmethanediisocyanate, hexamethylene diisocyanate, and 1,4-cyclohexane diisocyante; and commercially available products such as epoxy compounds including Epikote 812, 815, 826, 828, 834, 836, 871, 1001, 1004, 1007, 1009, and 1031 (manufactured by Japan Epoxy Resins Co., Ltd.); Araldite 6600, 6700, 6800, 502, 6071, 6084, 6097, and 6099 (manufactured by Ciba Specialty Chemicals K.K.); DER331, 332, 333, 661, 644, and 667 (manufactured by Dow Chemical Company); melamine-type curing agents such as Cymel 300, 301, 303, 350, 370, 771, 325, 327, 703, 712, 701, 272, 202, Mycoat 506 and 508 (manufactured by Mitsui Cyanamid); benzoguanamine-type curing agents such as Cymel 1123, 1123-10, 1128, Mycoat 102, 105, 106, and 130 (manufactured by Mitsui Cyanamid) and glycoluril-type curing agents such as Cymel 1170 and 1172 (manufactured by Mitsui Cytec, Ltd.) and NIKALAC N-2702 (manufactured by Sanwa Chemical Co., Ltd.); and the like can be given. Among these, the melamine-type curing agents, the glycoluril-type curing agents, and the like are preferable.

These curing agents may be used individually or in combination of two or more. A polynuclear phenol and a curing agent may be used in combination as the crosslinking agent (D).

The amount of the crosslinking agent (D) is preferably 100 parts by mass or less, more preferably 1 to 50 parts by mass, and particularly preferably 1 to 20 parts by mass for 100 parts by mass of the aminated fullerene (A). These composition can effectively prevent can effectively prevent intermixing between the resulting resist under layer film and a resist film produced thereon and can prevent cracks in the resist under layer film.

[1-5] (E) Thermoset Resin

The resist under layer film-forming composition of the present invention may further contain the thermoset resin (E) as required, insomuch as the desired effect of the present invention is not reduced.

Various thermoset resins may be used as the thermoset resin (E). The thermoset resin (E) becomes insoluble in a solvent when cured by heating and has a function of preventing intermixing between the resist under layer film and the resist film formed on the resist under layer film.

As examples of the thermoset resin (E), acrylic resins (thermoset acrylic resins), phenol resins, urea resins, melamine resins, amino resins, aromatic hydrocarbon resins, epoxy resins, and alkyd resins can be given. Of these thermoset resins, urea resins, melamine resins, and aromatic hydrocarbon resins are preferable.

The amount of the thermoset resin (E) is preferably 20 parts by mass or less, and more preferably 1 to 10 parts by mass for 100 parts by mass of the aminated fullerene (A). These composition can effectively prevent can effectively prevent intermixing between the resulting resist under layer film and a resist film produced thereon.

[1-6] (F) Other Additives

The resist under layer film-forming composition of the present invention may contain various other additives (F) such as a radiation absorber and a surfactant as required, insomuch as the desired effect of the present invention is not reduced.

Examples of the radiation absorber include a dye such as an oil soluble dye, a disperse dye, a basic dye, a methine dye, a pyrazole dye, an imidazole dye, and a hydroxyazo dye; a fluorescent bleach such as a bixin derivative, a norbixin, a stilbene, a 4,4'-diaminostilbene derivative, a cumarin derivative, and a pyrazoline derivative; a UV absorber such as a hydroxyazo dye, and Cinubin 234 and Cinubin 1130 (manufactured by Ciba Geigy Corp.); and an aromatic compound such as an anthracene derivative and an anthraquinone derivative. These radiation absorbers may be used individually or in combination of two or more.

The amount of the radiation absorber is preferably 100 parts by mass or less, and more preferably 1 to 50 parts by mass for 100 parts by mass of the aminated fullerene (A).

The surfactants have an effect of improving coatability, striation, wettability, developability, and the like. As examples of the surfactant, a nonionic surfactant such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75 and No. 95 (manufactured by Kyoeisha Chemical Co., Ltd.), FFTOP EF101, EF204, EF303, and EF352 (manufactured by JEMCO, Inc.), MEGAFAC F171, F172, and F173 (manufactured by Dainippon Ink and Chemicals, Inc.), Fluorad FC430, FC431, FC135, and FC93 (manufactured by Sumitomo 3M Ltd.), Asahi Guard AG710, Surflon S382, SC101, SC102, SC103, SC104, SC105, and SC106 (manufactured by Asahi Glass Co., Ltd.), and the like can be given. These surfactants may be used individually or in combination of two or more.

The amount of the surfactant is preferably 15 parts by mass or less, and more preferably 0.001 to 10 parts by mass for 100 parts by mass of the aminated fullerene (A).

The resist under layer film-forming composition of the present invention may further contain other additives such as a storage stabilizer, a defoamer, an adhesion auxiliary agent, and the like in addition to the radiation absorbers and the surfactants mentioned above.

[2] Method for Forming Resist Under Layer Film

One embodiment of the method for forming the resist under layer film will now be described. The method for forming the resist under layer film of the present invention comprises applying the resist under layer film-forming composition described above to a substrate and baking the applied composition in an inert gas atmosphere together with the substrate.

According to the method of the present invention, a resist under layer film having excellent etching resistance and capable of faithfully transforming a resist pattern to a substrate can be obtained in a reproducible manner without bending the under layer film pattern in a dry etching process.

As examples of the substrate to be processed used for forming the resist under layer film of the present invention, insulation films such as silicon oxide, silicon nitride, silicon oxynitride, or polysiloxane, and interlayer dielectric films such as a wafer covered with a low dielectric insulation film such as "Black Diamond" (manufactured by AMAT), "SiLK" (manufactured by Dow Chemical Co.), and "LKD5109" (manufactured by JSR Corp.) can be given. As the substrate, a substrate having a pattern of a wiring gutter (trench), a plug groove (via), and the like may be used.

There are no specific limitations to the method of applying the composition for forming the resist under layer film to a substrate. A spin-coating method, for example, can be used.

In the method for forming the resist under layer film of the present invention, the above-mentioned resist under layer film-forming composition (specifically, a coated film of the resist under layer film-forming composition formed on the substrate) is cured by baking in an inert gas atmosphere together with the substrate.

The inert gas used here is any of nitrogen gas, argon gas, helium gas, xenon gas, or krypton gas. An increase in the oxygen content in the resist under layer film can be prevented by forming the resist under layer film in an inert gas atmosphere, whereby the etching resistance of the resist under layer film can be further promoted.

The baking temperature in the resist under layer film forming-method of the present invention is not particularly limited. A temperature in a range of 90 to 550° C. is preferable, with a more preferable range being 90 to 450° C., and a particularly preferable temperature being 90 to 300° C. When the composition for forming the resist under layer film contains a thermal acid generator, the coating can be sufficiently cured at a temperature of about 90 to 150° C., for example.

Although there are no particular limitations to the thickness of the resist under layer film formed by the resist under layer film forming-method of the present invention, a thickness between 100 to 20,000 nm is preferable.

The resist under layer film forming-method of the present invention may further comprise a step of curing the coating formed from the resist under layer film-forming composition by exposure to radiation. The type of radiation used for exposure is appropriately selected from among visible rays, ultraviolet rays, deep ultraviolet rays, X-rays, electron beams, γ-rays, molecular beams, ion beams, and the like according to the type of the acid generator (C) when the acid generator (C) is added to the composition for forming a resist under layer film. When the composition for forming the resist under layer film contains a photoacid generator, the coating can be sufficiently cured at an ordinary temperature.

[3] Pattern-Forming Method

One embodiment of the pattern-forming method will now be described. The pattern forming method of the present invention comprises (1) a step of forming a resist under layer film on a substrate by applying the resist under layer film-forming composition as described above, (2) a step of forming a resist film on the resist under layer film by applying a resist composition, (3) a step of selectively exposing the resist film to radiation through a photomask, (4) a step of developing the exposed resist film to form a resist pattern, and (5) a step of dry etching the resist under layer film and the substrate using the resist pattern as a mask (etching mask).

According to the pattern-forming method of the present invention, a resist pattern can be faithfully transferred to a substrate with good reproducibility in a dry-etching process. Each step of the pattern-forming method of the present invention will now be described.

[3-1] Step (1)

In the step (1) of the pattern-forming method of the present invention, a resist under layer film is formed on a substrate using the above-described resist under layer film-forming composition. A substrate with a resist under layer film formed thereon can be obtained in this step.

As examples of the substrate, insulation films of silicon oxide, silicon nitride, silicon oxynitride, or polysiloxane, and interlayer dielectric films such as a wafer covered with a low dielectric insulation film such as "Black Diamond" (manufactured by AMAT), "SiLK" (manufactured by Dow Chemical Co.), and "LKD5109" (manufactured by JSR Corp.) can be given. As the substrate, a substrate having a pattern of a wiring gutter (trench), a plug groove (via), and the like may be used.

There are no specific limitations to the method of applying the composition for forming the resist under layer film to a substrate. A spin-coating method can be used, for example. Since the resist under layer film-forming composition can fill grooves on the substrate, the composition can form a desired pattern on the substrate in the later-described etching step.

The resist under layer film can be formed by curing the coating produced by applying the resist under layer film-forming composition on the substrate either by exposing or heating the coating. The type of radiation used for exposure is appropriately selected from among visible rays, ultraviolet rays, deep ultraviolet rays, X-rays, electron beams, γ-rays, molecular beams, ion beams, and the like according to the type of the acid generator (C) when the acid generator (C) is added to the composition. When the composition contains a photoacid generator, the coating can be sufficiently cured at an ordinary temperature.

The temperature for heating the coating produced by applying the composition for forming the resist under layer film is not particularly limited. A temperature in a range of 90 to 550° C. is preferable, with a more preferable range being 90 to 450° C., and particularly preferable temperature being 90 to 300° C. When the composition contains a thermal acid generator, the coating can be sufficiently cured at a temperature of about 90 to 150° C., for example.

Although not particularly limited, it is preferably to heat or expose the coating produced by applying the resist under layer film-forming composition in an inert gas atmosphere. The inert gas used here is any of nitrogen gas, argon gas, helium gas, xenon gas, or krypton gas. An increase in the oxygen content in the resist under layer film can be prevented by forming the resist under layer film in an inert gas atmosphere, whereby the etching resistance of the resist under layer film can be further promoted.

Although there are no particular limitations to the thickness of the resist under layer film formed in the step (1), a thickness between 100 to 20,000 nm is preferable.

The pattern forming method of the present invention may further comprise a step (1') of forming an intermediate layer on the resist under layer film after the step (1), as required. The intermediate layer is a layer for reinforcing the functions possessed by the resist under layer film or the resist film, or for providing the functions with the resist under layer film or the resist film which are not possessed by these films. When an antireflection film is formed as the intermediate layer, the intermediate film can reinforce the antireflection function of the resist under layer film.

The intermediate layer may be formed using an organic compound or an inorganic oxide. As the organic compound, materials commercially available under the tradenames of DUV-42, DUV-94, ARC-28, ARC-29, and the like manufactured by Brewer Science, Inc., and AR-3, AR-19, and the like manufactured by Lohm and Haas Company can be used. As the inorganic oxide, materials commercially available under the tradenames of NFC SOG01, NFC SOG04, and the like manufactured by JSR Corp., and polysiloxane, titanium oxide, aluminum oxide, tungsten oxide, and the like formed by the CVD method can be used.

Although there are no particular limitations to the method for forming the intermediate layer, a coating method, a CVD method, and the like can be used. Of these, the coating method is preferable. When the coating method is used, the intermediate layer may be formed continuously after forming the resist under layer film.

There are also no particular limitations to the thickness of the intermediate layer. The thickness is appropriately selected according to the demanded functions from a range preferably of 10 to 3000 nm, and more preferably 20 to 300 nm in the case of a general lithographic process, for example. If the thickness of the intermediate layer is less than 10 nm, there may be a case in which the intermediate layer is etched and lost during etching of the resist under layer film. If the thickness exceeds 3000 nm, the process conversion difference increases when transferring the resist pattern to the intermediate layer.

[3-2] Step (2)

In the step (2) of the pattern-forming method of the present invention, a resist film is formed on the resist under layer film produced in the step (1) using the resist composition. When an intermediate layer is formed on the resist under layer film, the resist film is formed on the resist under layer film and the intermediate layer.

As preferred examples of the resist composition preferably used in the step (2), a positive-tone or a negative-tone chemically amplified resist composition containing a photoacid generator, a positive-tone resist composition comprising an alkali-soluble resin and a quinondiazido sensitizer, and a negative-tone resist composition comprising an alkali-soluble resin and a crosslinking agent can be given.

Although there are no particular limitations to the solid concentration of the resist composition, a concentration between 5 to 50 mass % is preferable. A resist composition filtered through a membrane filter with a pore size of about 0.2 μm is preferably used. A commercially available resist composition may be used as is in the pattern-forming method of the present invention.

There are no particular limitations to the method of applying the resist composition. A general method such as a spin-coating method can be used. The amount of the resist composition used is adjusted so that a resist film having a specified thickness can be obtained.

The resist film can be formed by volatilizing the solvent from the coating (solvent contained in the resist composition) that has been produced by applying the resist composition by prebaking the coating. The prebaking temperature is appropriately adjusted according to the type of the resist composition in a range preferably from 30 to 200° C., and more preferably from 50 to 150° C.

[3-3] Step (3)

In the step (3) of the pattern-forming method of the present invention, a resist film obtained in the step (2) is selectively exposed to radiation through a photomask.

Radiation used for exposure is appropriately selected according to the type of the photoacid generator used in the resist composition from among visible rays, ultraviolet rays, deep ultraviolet rays, X-rays, electron beams, γ-rays, molecular beams, ion beams, and the like. Of these types of radiation, use of deep ultraviolet rays, particularly those produced by a KrF excimer laser (wavelength: 248 nm), an ArF excimer laser (wavelength: 193 nm), an $F_2$ excimer laser (wavelength: 157 nm), a $Kr_2$ excimer laser (wavelength: 147 nm), an ArKr excimer laser (wavelength: 134 nm), and extreme ultraviolet rays (wavelength: 13 nm) are preferable. There are also no particular limitations to the method of exposure. A method used in a general pattern forming method may be employed.

[3-4] Step (4)

In the step (4) of the pattern-forming method of the present invention, a resist pattern is formed by developing the resist film exposed to radiation in the step (3).

The developer used in this step is appropriately selected according to the type of the resist composition. Examples of the developer for the positive-tone chemically amplified resist composition and the positive-tone resist composition containing an alkali-soluble resin include alkaline aqueous solutions such as sodium hydroxide, potassium hydroxide, sodium carbonate, sodium silicate, sodium meta-silicate, ammonia, ethylamine, n-propylamine, diethylamine, di-n-propylamine, triethylamine, methyldiethylamine, dimethyl ethanolamine, triethanolamine, tetramethyl ammonium hydroxide, tetraethyl ammonium hydroxide, pyrrole, piperidine, choline, 1,8-diazabicyclo[5.4.0]-7-undecene, and 1,5-diazabicyclo[4.3.0]-5-nonene. An appropriate amount of an aqueous organic solvent, alcohol such as methanol and ethanol, and a surfactant can be optionally added to the alkaline aqueous solution.

Examples of the developer for the negative-tone chemically amplified resist composition and the negative-tone resist composition containing an alkali-soluble resin include aqueous solutions containing an alkali, for example, inorganic alkali compounds such as sodium hydroxide, potassium hydroxide, sodium carbonate, sodium silicate, sodium meta-silicate, and ammonia, primary amines such as ethylamine and n-propylamine, secondary amines such as diethylamine and di-n-butylamine, tertiary amines such as triethylamine and methyldiethylamine, alcohol amines such as dimethyl ethanolamine and triethanolamine, quaternary ammonium salts such as tetramethyl ammonium hydroxide, tetraethyl ammonium hydroxide, and choline, and cyclic amines such as pyrrole and piperidine.

In the step (4), the developed resist film is washed and dried to form the target resist pattern conforming to the pattern of the photomask.

In this step (4), it is preferable to postbake the resist film before development (i.e. after exposure to radiation in the step (3)) in order to improve resolution, pattern profile, developability, and the like. The temperature of postbaking is appropriately adjusted according to the type and the like of the resist composition used in a range preferably of 50 to 200° C., and more preferably 80 to 150° C.

[3-5] Step (5)

In the step (5) of the pattern-forming method of the present invention, a pattern is formed by dry etching the resist under layer film and the substrate by using the resist pattern formed in the step (4) as a mask (etching mask). When an intermediate layer is formed on the resist under layer film, the intermediate layer is dry-etched together with the resist under layer film and the substrate.

The dry-etching is carried out using a general dry-etching device. As a source gas used in the dry-etching, an oxygen-containing gas such as $O_2$, CO and $CO_2$, an inert gas such as He, $N_2$, and Ar, a chlorine-containing gas such as $Cl_2$ and $BCl_4$, as well as $H_2$, $NH_4$, and the like can be used depending on the element composition. A mixture of these gases may also be used.

Since the resist under layer film-forming composition used in the pattern forming method of the present invention contains the aminated fullerene (A) which is formed from a fullerene having substantially 100 mass % carbon content and a secondary amine which is comparatively easily decomposed by heat, an acid, and the like, a resist under layer film with a high carbon content and a low hydrogen content can be formed by the above step (1) of forming a resist under layer film. For this reason, the resist under layer film exhibits excellent etching resistance and capability of prohibiting bending of an under layer film pattern in an etching process of a substrate.

According to the pattern forming method of the present invention, a desired pattern for processing a substrate can be formed by appropriately performing the steps (1) to (5).

EXAMPLES

The present invention is described in detail below by way of examples. Note that the present invention is not limited to the following examples. "Part(s)" and "%" in Examples and Comparative Examples are expressed on a mass basis, unless otherwise indicated.

[1] Preparation of Composition for Forming Resist Under Layer Film

Details of (A) aminated fullerenes, (A') aminated fullerene derivatives, (B) solvents, (C) acid generators, and (D) crosslinking agents used for preparing the resist under layer film-forming compositions (U-1) to (U-9) are described below.

<(A) Aminated Fullerenes>

Aminated fullerene (A-1): Aminated fullerene (A-1) was synthesized as follows. A separable flask equipped with a condenser was charged with 10 parts by mass of a commercially available fullerene (fullerene $C_{60}$) and 400 parts by mass of t-butoxycarbonylpiperazine in a nitrogen stream. The mixture was stirred at 60° C. for two days. Methyl isobutyl ketone was added to the reaction solution to separate insoluble components by filtration. The solid was washed with water until the wash water became neutral. Methyl isobutyl ketone was removed by vacuum drying to obtain an aminated fullerene (A-1) shown by the following formula (2).

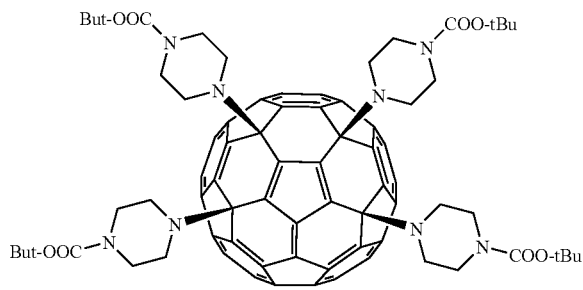

(2)

Aminated fullerene (A-2): The aminated fullerene (A-2) of the following formula (3) was prepared in the same method of synthesizing the aminated fullerene (A-1), except for using morpholine instead of t-butoxycarbonylpiperazine.

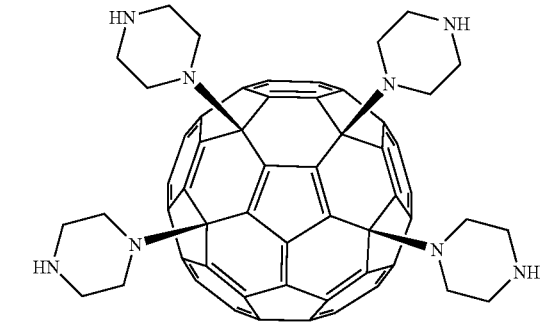

(3)

<Comparative Fullerene Derivatives (A')>

Comparative fullerene derivatives (A'-1): The comparative fullerene derivatives (A'-1) was synthesized as follows. A separable flask equipped with a thermometer was with 1 part by mass of 4-hydroxymethylstyrene, 8 parts by mass of fullerene (fullerene $C_{60}$), 86.5 parts by mass of toluene, and 4.3 parts by mass of azobisisobutyronitrile. The mixture was stirred at 80° C. for 24 hours. The reaction solution was filtered through a filter paper, the filtrate was condensed, and the resulting solid was dissolved in 2-heptanone.

The insoluble components were removed by filtration. The filtrate was subjected to re-precipitation in a large amount of hexane, then filtrated and dried to obtain the comparative fullerene derivatives (A'-1). The comparative fullerene derivatives (A'-1) can be synthesized by, for example, a method described in Macromolecules 1996, 29, 3826-3830.

<(B) Solvent>

Solvent (B-1): Propylene glycol monomethyl acetate Solvent (B-2): cyclohexanone

<(C) Acid Generator>

Acid generator (C-1): Bis(4-t-butylphenyl)iodonium nonafluoro-n-butanesulfonate (BBI-109 manufactured by Midori Kagaku Co., Ltd.)

Acid generator (C-2): A compound shown by the following formula (4) (CGI-1397 manufactured by Ciba Specialty Chemical Co.)

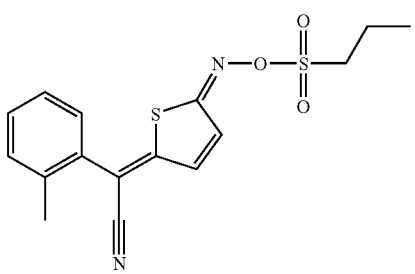

(4)

Acid generator (C-3): A compound shown by the following formula (5) (CGI-1905 manufactured by Ciba Specialty Chemical Co.)

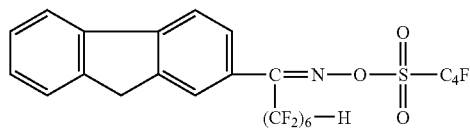

(5)

<(D) Crosslinking Agents>

Crosslinking agents (D-1): A compound shown by the following formula (6) (MX-279 manufactured by Nippon Carbide Industries Co., Inc.)

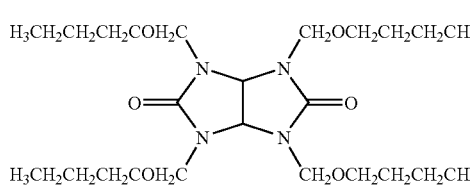

(6)

[1-1] Preparation of Resist Under Layer Film-Forming Composition (U-1)

10 parts by mass of the aminated fullerene (A-1), 0.2 parts by mass of bis(4-t-butylphenyl)iodonium nonafluoro-n-butanesulfonate (acid generator (C-1)), and 0.1 part by mass of tetramethoxy methyl glycoluril (crosslinking agent (D-1)) were dissolved in 89.7 parts by mass of propylene glycol monomethyl acetate (solvent (B-1)). The solution was filtered using a membrane filter with a pore diameter of 0.1 μm to prepare a resist under layer film-forming composition (U-1). The formulation of the resist under layer film-forming composition (U-1) is shown in Table 1.

TABLE 1

| Resist under layer film-forming composition | Aminated fullerene (A) Type | Part by mass | Comparative fullerene derivatives (A') Type | Part by mass | Solvent (B) Type | Part by mass | Acid generator (C) Type | Part by mass | Crosslinking agent (D) Type | Part by mass |
|---|---|---|---|---|---|---|---|---|---|---|
| U-1 | A-1 | 10 | — | — | B-1 | 89.7 | C-1 | 0.2 | D-1 | 0.1 |
| U-2 | A-1 | 10 | — | — | B-1 | 89.9 | C-2 | 0.1 | — | — |
| U-3 | A-1 | 10 | — | — | B-1 | 89.7 | C-3 | 0.3 | — | — |
| U-4 | A-1 | 10 | — | — | B-1 | 90 | — | — | — | — |
| U-5 | A-2 | 10 | — | — | B-1 | 89.7 | C-3 | 0.3 | — | — |
| U-6 | — | — | A'-1 | 10 | B-2 | 89.7 | C-1 | 0.2 | D-1 | 0.1 |
| U-7 | — | — | A'-1 | 10 | B-2 | 89.5 | C-1 | 0.5 | — | — |
| U-8 | — | — | A'-1 | 10 | B-2 | 90 | — | — | — | — |
| U-9 | Resist under layer film-forming composition "NFC CT08" | | | | | | | | | |

[1-2] Preparation of Resist Under Layer Film-Forming Compositions (U-2) to (U-5)

Resist under layer film-forming compositions (U-2) to (U-5) were prepared in the same manner as in the preparation of the resist under layer film-forming composition (U-1) except for using the (A) aminated fullerenes, (B) solvents, (C) acid generators, and (D) crosslinking agents shown in Table 1 in amounts shown in Table 1.

[1-3] Preparation of Resist Under Layer Film-Forming Compositions (U-6) to (U-8)

Resist under layer film-forming compositions (U-6) to (U-8) were prepared in the same manner as in the preparation of the resist under layer film-forming composition (U-1) except for using the comparative fullerene derivative (A') instead of aminated fullerene (A-1) and using the (B) solvents, (C) acid generators, and (D) crosslinking agents shown in Table 1 in amounts shown in Table 1.

[1-4] Preparation of Resist Under Layer Film-Forming Composition (U-9)

A resist under layer film-forming composition (NFC CT08 manufactured by JSR Corp.) was used as a resist under layer film-forming composition (U-9).

[2] Preparation of Resist Under Layer Film

Example 1

The resist under layer film-forming composition (U-1) was applied to a substrate by spin coating and baked in the air at 300° C. for 60 seconds to form a resist under layer film. A substrate of Example 1 having a resist under layer film formed thereon was thus obtained. The resist under layer film-forming composition, baking conditions, and baking atmosphere are shown in Table 2.

In this Example, two types of substrates, a silicon wafer and a TEOS substrate, were used to obtain two substrates with a resist under layer film by forming a resist under layer film on each of the substrates. A resist under layer film with a thickness of 600 nm was prepared on the TEOS substrate.

TABLE 2

| | | Resist under layer film-forming composition | Baking conditions | Baking atmosphere |
|---|---|---|---|---|
| Example | 1 | U-1 | 300° C./60 s | In air |
| | 2 | U-2 | 300° C./60 s | In air |
| | 3 | U-3 | 300° C./60 s | In air |
| | 4 | U-4 | 300° C./60 s | In air |
| | 5 | U-5 | 300° C./60 s | In air |
| | 6 | U-1 | 250° C./60 s | In air |
| | 7 | U-2 | 250° C./60 s | In air |
| | 8 | U-3 | 250° C./60 s | In air |
| | 9 | U-4 | 250° C./60 s | In air |
| | 10 | U-5 | 250° C./60 s | In air |
| | 11 | U-1 | 300° C./60 s | In nitrogen |
| | 12 | U-2 | 300° C./60 s | In nitrogen |
| | 13 | U-3 | 300° C./60 s | In nitrogen |
| | 14 | U-4 | 300° C./60 s | In nitrogen |
| | 15 | U-5 | 300° C./60 s | In nitrogen |
| | 16 | U-4 | 350° C./300 s | In nitrogen |
| | 17 | U-4 | 400° C./300 s | In nitrogen |
| Comparative Example | 1 | U-6 | 300° C./60 s | In air |
| | 2 | U-7 | 300° C./60 s | In air |
| | 3 | U-8 | 300° C./60 s | In air |
| | 4 | U-9 | 300° C./60 s | In air |
| | 5 | U-6 | 300° C./60 s | In nitrogen |

Examples 2 to 17 and Comparative Examples 1 to 5

Two types of substrates, one silicon wafer and the other TEOS substrate, were used as in Example 1. Two substrates with a resist under layer film were prepared by applying the resist under layer film-forming compositions (U-1) to (U-9) shown in Table 2 on each of the two substrates by spin-coating and baking the coating under the conditions and atmospheres shown in Table 2.

[3] Evaluation of Resist Under Layer Film

In order to evaluate the performance of the resist under layer film on the substrates obtained in Examples 1 to 17 and Comparative Examples 1 to 5, positive-tone resist composition solutions for ArF were prepared as follows.

[3-1] Preparation of Resist Composition Solution for ArF

A separable flask equipped with a reflux condenser was charged with 29 parts by mass of 8-methyl-8-t-butoxycarbonylmethoxycarbonyltetracyclo[4.4.0.1$^{2,5}$.1$^{7,10}$]dodec-3-ene (monomer ($\alpha$)), 10 parts by mass of 8-methyl-8-hydroxytetracyclo[4.4.0.1$^{2,5}$.1$^{7,10}$]dodec-3-ene (monomer ($\beta$)), 18 parts by mass of maleic anhydride (monomer ($\gamma$)), 4 parts of 2,5-dimethyl-2,5-hexanediol diacrylate, 1 part by mass of t-dodecylmercaptan, 4 parts by mass of azobisisobutyronitrile, and 60 parts by mass of 1,2-diethoxyethane. The mixture was polymerized at 70° C. for six hours while stirring.

After the reaction, the reaction mixture was poured into a large amount of a mixed solvent of n-hexane and i-propyl alcohol (mass ratio: 1:1) to solidify the resin. The solidified resin was washed several times with the mixed solvent, dried under vacuum to obtain a resin containing repeating units (a), (b), and (c), each having the following structure, each of which respectively originating from the above-mentioned monomer ($\alpha$), monomer ($\beta$), and monomer ($\gamma$) (yield: 60 mass %). The molar ratio of the repeating units (a), (b), and (c) was 64:18:18 and the weight-average molecular weight (Mw) of the resin was 27,000.

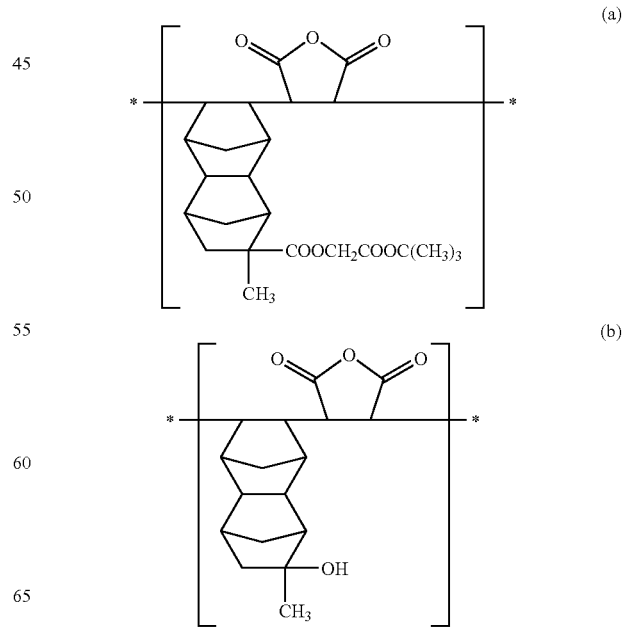

-continued

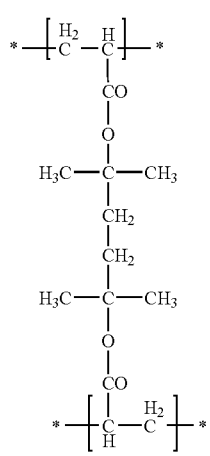
(c)

80 parts by mass of the above resin, 1.5 parts by mass of 1-(4-methoxynaphthalen-1-yl)tetrahydrothiophenium nonafluoro-n-butanesulfonate, and 0.04 parts by mass of tri-n-octylamine were dissolved in 533 parts by mass of propylene glycol monomethyl ether acetate to obtain a resist composition solution for ArF.

[3-2] Performance Evaluation

Elemental analysis of the resist under layer film was carried out and etching resistance and bending resistance were evaluated using the substrates with a resist under layer film formed thereon obtained in Examples 1 to 17 and Comparative Examples 1 to 5. The results are shown in Table 3.

<Etching Resistance>

Silicon wafer substrates having a resist under layer film formed thereon were used. The resist under layer film on each of the substrate was subjected to an etching process using an etching device (EXAM manufactured by Sinko Seiki Co., Ltd.) in $CF_4/Ar/O_2$ ($CF_4$: 40 ml/min, Ar: 20 ml/min, $O_2$: 5 ml/min; pressure: Pa; RF power: 200 W; processing time: 40 seconds; temperature: 15° C.). The thicknesses before and after etching were measured to determine the etching rate, whereby the etching resistance was evaluated.

In calculating the etching rate, a standard resist under layer film was prepared from a resist under layer film-forming composition "NFC CT08" manufactured by JSR Corp. The etching resistance was evaluated as "Excellent" when the etching rate was −10% or less of the etching rate of the standard resist under layer film, as "Good" when the etching rate was more than −10%, but not more than 0% of the etching rate of the standard resist under layer film, and as "Average" when the etching rate was more than 0%, but not more than 10% of the etching rate of the standard resist under layer film.

<Bending Resistance>

Intermediate layer films with a thickness of 50 nm were prepared by applying a solution composition for forming an intermediate layer for three-layer resist processing (NFC SOG080 manufactured by JSR Corp.) to the resist under layer films (thickness: 600 nm) prepared in the Examples and Comparative Examples, in which a TEOS substrate was used as a substrate, by spin coating and heating the coating for 60 seconds on a hot plate at 200° C. and for another 60 seconds at 300° C.

After that, a photoresist film (resist film) with a thickness of 200 nm was prepared by applying the above-mentioned resist

TABLE 3

| | | Carbon content (mass %) | Hydrogen content (mass %) | Oxygen content (mass %) | Nitrogen content (mass %) | Etching resistance | Bending resistance |
|---|---|---|---|---|---|---|---|
| Example | 1 | 86.0 | 1.8 | 10.8 | 1.4 | Excellent | Good |
| | 2 | 87.2 | 1.2 | 9.8 | 1.8 | Excellent | Good |
| | 3 | 87.8 | 1.4 | 8.8 | 2.0 | Excellent | Good |
| | 4 | 88.0 | 1.0 | 9.1 | 1.9 | Excellent | Good |
| | 5 | 88.0 | 0.8 | 9.2 | 2.0 | Excellent | Good |
| | 6 | 84.9 | 2.4 | 10.8 | 1.9 | Excellent | Good |
| | 7 | 85.8 | 2.2 | 10.0 | 2.0 | Excellent | Good |
| | 8 | 86.5 | 2.3 | 9.2 | 2.0 | Excellent | Good |
| | 9 | 86.9 | 2.0 | 9.1 | 2.0 | Excellent | Good |
| | 10 | 86.5 | 2.5 | 8.8 | 2.2 | Excellent | Good |
| | 11 | 90.8 | 1.5 | 4.4 | 3.3 | Excellent | Good |
| | 12 | 93.3 | 0.2 | 3 | 3.5 | Excellent | Good |
| | 13 | 91.5 | 0.6 | 4.1 | 3.8 | Excellent | Good |
| | 14 | 93.0 | 0.5 | 2.7 | 3.8 | Excellent | Good |
| | 15 | 92.0 | 0.8 | 4 | 3.2 | Excellent | Good |
| | 16 | 94.5 | 0.4 | 2.5 | 2.6 | Excellent | Good |
| | 17 | 97.0 | 0.0 | 0.6 | 2.4 | Excellent | Good |
| Comparative Example | 1 | 87.0 | 6.5 | 5.8 | 0.7 | Good | Bad |
| | 2 | 86.5 | 6.5 | 6.0 | 1 | Average | Bad |
| | 3 | 85.6 | 5.6 | 7.0 | 1.8 | Average | Bad |
| | 4 | 87.3 | 6.0 | 4.5 | 2.2 | Good | Bad |
| | 5 | 87.2 | 7.0 | 5.0 | 0.8 | Average | Bad |

The methods of elemental analysis and measurement of etching resistance and bending resistance were as follows.

<Elemental Composition of Resist Under Layer Film>

Contents (mass %) of carbon, hydrogen, oxygen, and nitrogen of the resist under layer films on each silicon wafer substrate were measured. An organic elemental analyzer manufactured by J-Science Co., Ltd. (CHN coder JM10) was used for analyzing the content of each element.

solution composition for ArF onto the intermediate layer by spin coating and prebaking the coating for 90 seconds on a hot plate at 130° C.

The resulting resists were exposed to an ArF excimer laser through a mask pattern for a period equivalent to the optimum exposure time using an ArF excimer laser photolithographic machine manufactured by NIKON Corp. (lens numerical aperture: 0.78, exposure wavelength: 193 nm). After postbaking on a hot plate at 130° C. for 90 seconds, the resist was developed using an aqueous solution of 2.38 mass % of tetramethylammonium hydroxide at 25° C. for one minute, washed with water, and dried to obtain an ArF positive-tone resist pattern.

The resulting resist pattern was transferred to the intermediate layer by dry etching to obtain an intermediate layer pattern. An under layer film pattern was formed by transferring the resist pattern onto the under layer film by dry etching using this intermediate layer pattern as a mask.

Furthermore, using this resist under layer film pattern as a mask, a pattern was formed on the TEOS substrate to a depth of 300 nm in $CF_4/Ar/O_2$. The resist under layer film pattern was observed using a scanning electron microscope to evaluate the bending resistance according to the following standard. The bending resistance was evaluated as "Good" when there was no bending in the under layer film pattern shape and as "Bad" when there was bending in the under layer film pattern shape.

Figure 2:
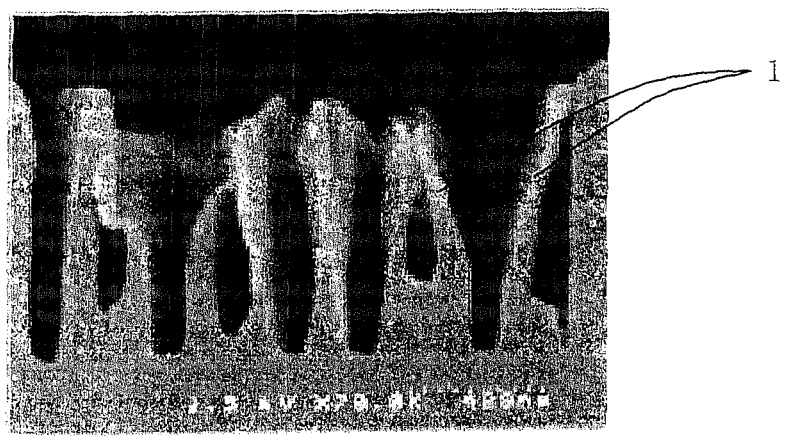
FIG. 2 is a scanning electron microscope photograph showing a cross-section of a resist under layer film pattern formed using the resist under layer film-forming composition of Comparative Example 3.

FIG. 1 is a scanning electron microscope photograph showing a cross-section of a resist under layer film pattern formed using the resist under layer film composition of Example 9, and FIG. 2 is a scanning electron microscope photograph showing a cross-section of a resist under layer film pattern formed using the resist under layer film composition of Comparative Example 3. It can be seen that the pattern 1 of the resist under layer film of Example 9 shown in FIG. 1 is normal with no bending, whereas the pattern 1 of the resist under layer film of Comparative Example 3 shown in FIG. 2 exhibits a bending.

[4] Discussion

As shown in Table 3, the bending resistance was "Good" in all of the resist under layer films of Examples 1 to 17. Etching resistance of these resist under layer films was also "Excellent". On the other hand; all of the resist under layer films of Comparative Examples 1 to 5 were evaluated to exhibit "Bad" bending resistance. The etching resistance of the resist under layer films of Comparative Examples 2, 3, and 5 were evaluated as exhibiting "Average" (the etching rate was 10% or less of the etching rate of the standard resist under layer film), indicating that these films do not satisfy the functions required for a resist under layer film.

These results are thought to have been caused by the difference in the carbon content and the hydrogen content of the resist under layer films. For example, the resist under layer films in Examples with a hydrogen content of not more than 3 mass % (0.0 to 2.5 mass %) showed "Good" bending resistance, whereas the resist under layer films in Comparative Examples with a hydrogen content of more than 5 mass % (5.6 to 7.6 mass %) showed "Bad" bending resistance.

It should be noted that the under layer film-forming composition used for forming the resist under layer films of Example 1 to 17 contained the aminated fullerene (A). It is thought that the amino group, which is the source of the hydrogen in the resist under layer films, decomposed in the course of the resist under layer film formation and, as a result, the hydrogen content in the resist under layer film has decreased.

On the other hand, the carbon content (mass %) is almost the same in the resist under layer films of the Examples and Comparative Examples. However, when the carbon content and the hydrogen content are converted into the number of atoms, the proportion of carbon atoms is higher than the hydrogen atoms in the resist under layer films of the Examples since the hydrogen has the lowest molecular weight. This is thought be the reason for improved etching resistance of the resist under layer films of the Examples as compared with the resist under layer films of the Comparative Examples.

As discussed above, the resist under layer film formed from the resist under layer film-forming composition which contains the aminated fullerene (A) has good etching resistance and bending resistance.

INDUSTRIAL APPLICABILITY

Since the resist under layer film of the present invention is formed from the resist under layer film-forming composition of the present invention, a resist under layer film which does not bend the under layer film pattern in the substrate etching process can be formed. The composition can be thus extremely suitably used for microfabrication in a lithographic process. In particular, the resist under layer film has excellent capability of transferring precise patterns, exhibits good etching selectivity in a dry-etching process, and ensures faithful transfer of a resist pattern to the substrate with good reproducibility and minimal over-etching of the resist under layer film.

In addition, improvement of production yield of the products in microfabrication, particularly of high integrated circuit element, can be expected because of the capability of prohibiting bending of an under layer film pattern in the etching process of a substrate.

The resist under layer film-forming method and the pattern-forming method of the present invention are very useful as a lithographic process, particularly a process for manufacturing high integrated circuit elements.

The invention claimed is:

1. A pattern-forming method comprising:
    forming a resist under layer film on a substrate by applying a composition comprising:
        (A) an aminated fullerene having at least one amino group bonded to a fullerene skeleton;
        (B) a solvent; and
        (C) an acid generator in an amount of 0.1 to 30 parts by mass for 100 parts by mass of (A) the aminated fullerene;
    forming a resist film on the resist under layer film by applying a resist composition;
    selectively exposing the resist film to radiation through a photomask;
    developing the exposed resist film to form a resist pattern; and
    dry etching the resist under layer film and the substrate using the resist pattern as a mask to form a pattern,
    wherein the composition does not include more than 20 parts by mass of resin for 100 parts by mass of (A) the aminated fullerene.

2. The pattern forming method according to claim 1, wherein the composition further comprises (D) a crosslinking agent.

3. The pattern forming method according to claim 1, wherein the composition further comprises (E) a thermoset resin.

4. The pattern forming method according to claim 1, wherein the amount of (C) the acid generator is 0.1 to 10 parts by mass for 100 parts by mass of (A) the aminated fullerene.

* * * * *